(12) United States Patent
Li et al.

(10) Patent No.: US 11,908,890 B2
(45) Date of Patent: Feb. 20, 2024

(54) ISOLATION STRUCTURE FOR STACKED VERTICAL TRANSISTORS

(71) Applicant: International Business Machines Corporation, Armonk, NY (US)

(72) Inventors: Juntao Li, Cohoes, NY (US); Kangguo Cheng, Schenectady, NY (US); Chen Zhang, Guilderland, NY (US); Zhenxing Bi, Dunn Loring, VA (US)

(73) Assignee: International Business Machines Corporation, Armonk, NY (US)

( * ) Notice: Subject to any disclaimer, the term of this patent is extended or adjusted under 35 U.S.C. 154(b) by 368 days.

(21) Appl. No.: 17/346,806

(22) Filed: Jun. 14, 2021

(65) Prior Publication Data

US 2021/0305364 A1 Sep. 30, 2021

Related U.S. Application Data

(62) Division of application No. 16/386,945, filed on Apr. 17, 2019, now Pat. No. 11,081,546.

(51) Int. Cl.

| | | |
|---|---|---|
| *H01L 29/786* | (2006.01) | |
| *H01L 29/78* | (2006.01) | |
| *H01L 29/66* | (2006.01) | |
| *H01L 29/06* | (2006.01) | |
| *H01L 27/092* | (2006.01) | |
| *H01L 29/165* | (2006.01) | |
| *H01L 21/3065* | (2006.01) | |
| *H01L 21/8238* | (2006.01) | |

(52) U.S. Cl.
CPC ...... *H01L 29/0649* (2013.01); *H01L 21/3065* (2013.01); *H01L 21/823828* (2013.01); *H01L 21/823878* (2013.01); *H01L 21/823885* (2013.01); *H01L 27/092* (2013.01); *H01L 29/165* (2013.01); *H01L 29/66666* (2013.01); *H01L 29/7827* (2013.01)

(58) Field of Classification Search
CPC .................................................. H01L 29/78642
See application file for complete search history.

(56) References Cited

U.S. PATENT DOCUMENTS

| | | | |
|---|---|---|---|
| 9,058,987 B2 | 6/2015 | Cheng et al. | |
| 9,245,885 B1 | 1/2016 | Xie et al. | |
| 9,627,511 B1 | 4/2017 | Cheng et al. | |
| 9,691,850 B2 | 6/2017 | Cheng et al. | |
| 9,831,131 B1 * | 11/2017 | Jacob | H01L 27/0688 |
| 9,997,413 B1 | 6/2018 | Leobandung | |

(Continued)

FOREIGN PATENT DOCUMENTS

WO 2017095409 A1 6/2017

OTHER PUBLICATIONS

List of IBM Patents or Patent Applications Treated as Related.

*Primary Examiner* — Moazzam Hossain
*Assistant Examiner* — Hajar Kolahdouzan
(74) *Attorney, Agent, or Firm* — Samuel Waldbaum; Ryan, Mason & Lewis, LLP

(57) ABSTRACT

A method for manufacturing a semiconductor device includes forming a first vertical transistor on a semiconductor substrate, and forming a second vertical transistor stacked on the first vertical transistor. In the method, an isolation layer is formed between the first and second vertical transistors. The isolation layer includes a rare earth oxide.

20 Claims, 15 Drawing Sheets

(56) References Cited

U.S. PATENT DOCUMENTS

| | | |
|---|---|---|
| 10,217,846 B1 | 2/2019 | Xie et al. |
| 2016/0093688 A1 | 3/2016 | Meldrim et al. |
| 2018/0069131 A1 | 3/2018 | Balakrishnan et al. |
| 2020/0006340 A1* | 1/2020 | Lilak ................. H01L 29/78696 |
| 2020/0105754 A1* | 4/2020 | Murthy ............. H01L 29/66545 |

* cited by examiner

US 11,908,890 B2

ISOLATION STRUCTURE FOR STACKED VERTICAL TRANSISTORS

BACKGROUND

Fin field-effect transistor (FinFET) devices include a transistor architecture that uses raised source-to-drain channel regions, referred to as fins. Known FinFET devices include fins with source/drain regions on lateral sides of the fins, so that current flows in a horizontal direction (e.g., parallel to a substrate) between source/drain regions at opposite ends of the fins in the horizontal direction. As horizontal devices are scaled down, there is reduced space for metal gate and source/drain contacts, which leads to degraded short-channel control and increased middle of the line (MOL) resistance.

Vertical field-effect transistors (VFETs) (also referred to as vertical transport field effect transistors (VTFETs)) are becoming viable device options for scaling semiconductor devices (e.g., complementary metal oxide semiconductor (CMOS) devices) to 5 nanometer (nm) node and beyond. VFET devices include fin channels with source/drain regions at ends of the fin channels on top and bottom sides of the fins. Current runs through the fin channels in a vertical direction (e.g., perpendicular to a substrate), for example, from a bottom source/drain region to a top source/drain region.

Conventional VFET structures include n-type and p-type transistors (e.g., nFET and pFET) side by side, which consumes a relatively large device footprint. Accordingly, there is a need for improved VFET structures with n- and p-type transistors which increase transistor density per unit chip area, while maintaining sufficient isolation between n- and p-type devices.

SUMMARY

According to an exemplary embodiment of the present invention, a method for manufacturing a semiconductor device includes forming a first vertical transistor on a semiconductor substrate, and forming a second vertical transistor stacked on the first vertical transistor. In the method, an isolation layer is formed between the first and second vertical transistors. The isolation layer includes a rare earth oxide.

According to an exemplary embodiment of the present invention, a semiconductor device includes a first vertical transistor disposed on a semiconductor substrate, and a second vertical transistor stacked on the first vertical transistor. An isolation layer is disposed between an upper source/drain region of the first vertical transistor and a lower source/drain region of the second vertical transistor. The isolation layer includes a rare earth oxide.

According to an exemplary embodiment of the present invention, a method for manufacturing a vertical transistor device includes forming a first lower source/drain region on a semiconductor substrate, forming a first channel region extending vertically from the first lower source/drain region, and forming a first upper source/drain region on an upper portion of the first channel region. In the method, an isolation layer including a rare earth oxide is formed on the first upper source/drain region, and a second lower source/drain region is formed on the isolation layer. The method further includes forming a second channel region extending vertically from the second lower source/drain region, and forming a second upper source/drain region on an upper portion of the second channel region. First and second gate region are formed around the first and second channel regions, respectively.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
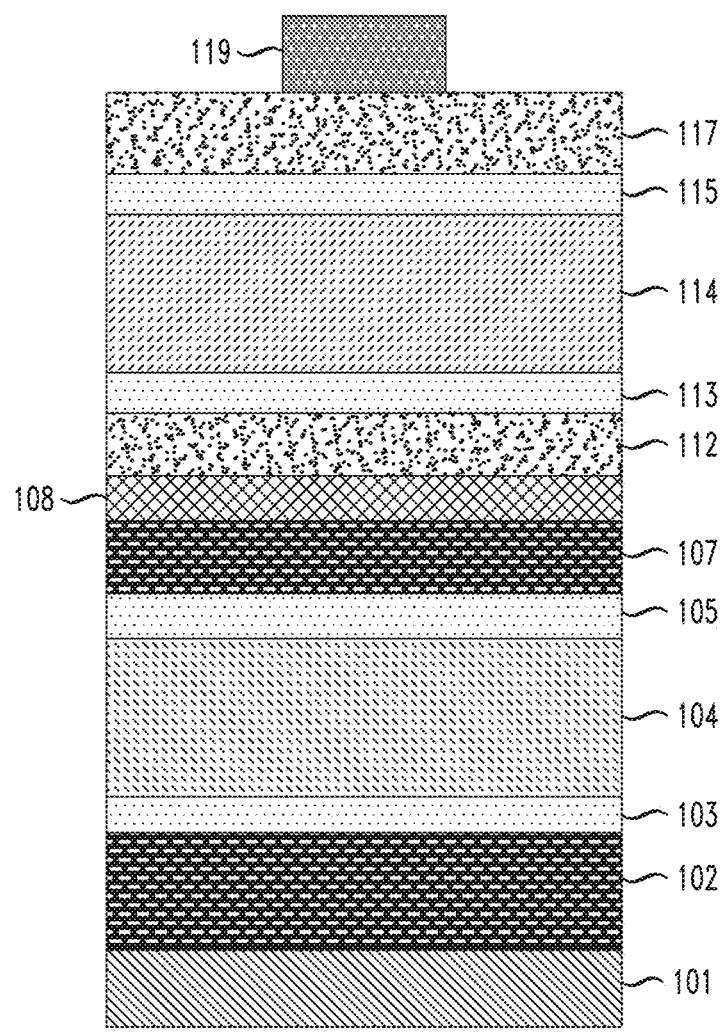
FIG. 1 is a cross-sectional view illustrating formation of a plurality of semiconductor and dielectric layers in a method of manufacturing a semiconductor device, according to an exemplary embodiment of the present invention.

Exemplary embodiments of the invention will now be discussed in further detail with regard to semiconductor devices and methods of manufacturing same and, in particular, to forming stacked vertical transistor devices.

It is to be understood that the various layers and/or regions shown in the accompanying drawings are not drawn to scale, and that one or more layers and/or regions of a type commonly used in, for example, field-effect transistor (FET), FinFET, VFET, CMOS, nanowire FET, nanosheet FETs, metal-oxide-semiconductor field-effect transistor (MOSFET), single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not necessarily be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FETs, FinFETs, VFETs, CMOSs, nanowire FETs, nanosheet FETs, SETs, and/or MOSFETs. By way of non-limiting example, the semiconductor devices can include, but are not necessarily limited to FET, FinFET, VFET, CMOS, nanowire FET, nanosheet FET, SET, CMOS and MOSFET devices, and/or semiconductor devices that use FET, FinFET, VFET, CMOS, nanowire FET, nanosheet FET, SET, CMOS and/or MOSFET technology.

As used herein, "height" refers to a vertical size of an element (e.g., a layer, trench, hole, opening, etc.) in the cross-sectional or three-dimensional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional or three-dimensional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional or three-dimensional views, and "horizontal" refers to a direction parallel to the top surface of the substrate in the cross-sectional or three-dimensional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

In accordance with one or more embodiments, a structure including vertically-stacked n-type and p-type vertical transport transistors is formed, which increases transistor density per unit chip area and improves device isolation. The embodiments utilize a rare earth oxide (REO) layer between the stacked n-type and p-type transistors to enable robust isolation between stacked nFET and pFET devices. Accordingly, the embodiments save device footprint area, while providing electronically isolated stacked vertical transport transistors.

The cross-sectional views in FIGS. 1-14 are taken perpendicular to a fin length extension direction (e.g., a length of the fin extends into the page). The cross-sectional view in FIG. 15 is taken parallel to a fin length extension direction (e.g., a length of the fin extends in left and right directions on the page).

FIG. 1 is a cross-sectional view illustrating formation of a plurality of semiconductor and dielectric layers in a method of manufacturing a semiconductor device, according to an exemplary embodiment of the present invention. Referring to FIG. 1, a semiconductor substrate 101 includes semiconductor material including, but not limited to, silicon (Si), silicon germanium (SiGe), silicon carbide (SiC), II-VI compound semiconductor or other like semiconductor. In addition, multiple layers of the semiconductor materials can be used as the semiconductor material of the substrate. The semiconductor substrate 101 can be a bulk substrate or a semiconductor-on-insulator substrate such as, but not limited to, a silicon-on-insulator (SOI), silicon-germanium-on-insulator (SGOI) or III-V-on-insulator substrate including a buried insulating layer, such as, for example, a buried oxide, nitride layer or aluminum oxide.

Multiple layers 102, 103, 104, 105, 107, 108, 112, 113, 114, 115 and 117 are epitaxially grown on the semiconductor substrate 101 by an integrated epitaxy process. A first doped layer 102 is formed on the substrate 101. According to an embodiment, the layer 102 is an n-type doped layer comprising epitaxially grown silicon (Si) or other semiconductor material, which is doped during epitaxial growth by in-situ doping and a dopant may include, for example, phosphorus (P) or arsenic (As), at various concentrations. For example, in a non-limiting example, a dopant concentration range may be $1 \times 10^{20}/cm^3$ to $1 \times 10^{21}/cm^3$. A patterned portion of the layer 102 forms a bottom source/drain region of first (e.g., lower) transistor of a vertical transistor stack. In accordance with an embodiment, the first transistor of a vertical transistor stack is an n-type VFET. A thickness (e.g., vertical height with respect to the underlying layer) of the layer 102 is in the range of about 20 nm to about 40 nm, but is not necessarily limited thereto.

During the integrated epitaxy process, a first undoped sacrificial layer 103 including, for example, silicon germanium (SiGe) (e.g., SiGe with 25% Ge (SiGe25)) or other semiconductor material which can be selectively etched with respect to the materials of layers 102, 104, 107, 108, 112, 114, 117 and 119, is epitaxially grown on the first doped layer 102. A thickness (e.g., vertical height with respect to the underlying layer) of the layer 103 is about 10 nm, but is not necessarily limited thereto.

An undoped layer 104 including, for example, Si or other semiconductor material is epitaxially grown on the undoped sacrificial layer 103. A patterned portion of the undoped layer 104 will form a channel region for a lower FET of two stacked FETs. A second undoped sacrificial layer 105 including, for example, SiGe (e.g., SiGe25) or other semiconductor material which can be selectively etched with respect to the materials of layers 102, 104, 107, 108, 112, 114, 117 and 119, is epitaxially grown on the undoped layer 104. A thickness (e.g., vertical height with respect to the underlying layer) of the layer 104 is in the range of about 30 nm to about 50 nm, but is not necessarily limited thereto.

A second doped layer 107 is formed on the second undoped sacrificial layer 105. According to an embodiment, the layer 107 is an n-type doped layer comprising epitaxially grown Si or other semiconductor material, which is doped during epitaxial growth by in-situ doping. For example, the layer 107 may comprise the same or similar material, dopant and dopant concentration as the layer 102. A patterned portion of the layer 107 forms an upper source/drain region the first transistor of the transistor stack (e.g., vertical nFET) comprising patterned portions of layers 102, 104 and 107. A thickness (e.g., vertical height with respect to the underlying layer) of the layer 107 is in the range of about 20 nm to about 40 nm, but is not necessarily limited thereto.

An isolation layer 108 including REO material, is epitaxially grown on the layer 107. According to an embodiment, the REO material includes, but is not necessarily limited to, erbium oxide ($Er_2O_3$), neodymium oxide ($Nd_2O_3$), praseodymium oxide ($Pr_2O_3$), cerium oxide ($CeO_2$), lanthanum oxide ($La_2O_3$), yttrium oxide ($Y_2O_3$) or gadolinium oxide ($Gd_2O_3$). The isolation layer is an insulating layer having crystalline material so that it may be epitaxially grown. Epitaxially grown rare earth oxides (REOs) are leveraged within the vertical transistor structure to ensure the isolation between the stacked vertical nFET and pFET transistors. A thickness (e.g., vertical height with respect to the underlying layer) of the layer 108 is in the range of about 10 nm to about 20 nm, but is not necessarily limited thereto.

A third doped layer 112 is formed on the isolation layer 108. According to an embodiment, the layer 112 is a p-type doped layer comprising epitaxially grown Si or other semiconductor material, which is doped during epitaxial growth by in-situ doping and a dopant may include, for example, boron (B), at various concentrations. For example, in a non-limiting example, a dopant concentration range may be $1 \times 10^{20}/cm^3$ to $1 \times 10^{21}/cm^3$. A patterned portion of the layer 112 forms a bottom source/drain region of second (e.g., upper) transistor of a vertical transistor stack. In accordance with an embodiment, the second transistor of a vertical transistor stack is a p-type VFET. A thickness (e.g., vertical height with respect to the underlying layer) of the layer 112 is in the range of about 20 nm to about 40 nm, but is not necessarily limited thereto.

During the integrated epitaxy process, a third undoped sacrificial layer 113 including, for example, SiGe (e.g., SiGe25) or other semiconductor material which can be selectively etched with respect to the materials of layers 102, 104, 107, 108, 112, 114, 117 and 119, is epitaxially grown on the third doped layer 112. A thickness (e.g., vertical height with respect to the underlying layer) of the layer 113 is about 10 nm, but is not necessarily limited thereto.

An undoped layer 114 including, for example, Si or other semiconductor material is epitaxially grown on the undoped sacrificial layer 113. A patterned portion of the undoped layer 114 will form a channel region for an upper FET of two stacked FETs. A fourth undoped sacrificial layer 115 including, for example, SiGe (e.g., SiGe25) or other semiconductor material which can be selectively etched with respect to the materials of layers 102, 104, 107, 108, 112, 114, 117 and 119, is epitaxially grown on the undoped layer 114. A thickness (e.g., vertical height with respect to the underlying layer) of the layer 114 is in the range of about 30 nm to about 50 nm, but is not necessarily limited thereto.

A fourth doped layer 117 is formed on the fourth undoped sacrificial layer 115. According to an embodiment, the layer 117 is a p-type doped layer comprising epitaxially grown Si or other semiconductor material, which is doped during epitaxial growth by in-situ doping. For example, the layer 117 may comprise the same or similar material, dopant and dopant concentration as the layer 112. A patterned portion of the layer 117 forms an upper source/drain region the second transistor of the transistor stack (e.g., vertical pFET) comprising patterned portions of layers 112, 114 and 117. A thickness (e.g., vertical height with respect to the underlying layer) of the layer 117 is in the range of about 20 nm to about 40 nm, but is not necessarily limited thereto.

A hardmask 119 including, for example silicon nitride (SiN) or other material, such as, but not necessarily limited to, silicon boron nitride (SiBN), siliconborocarbonitride (SiBCN) or siliconoxycarbonitride (SiOCN), is deposited on the fourth doped layer 117.

FIG. 1 illustrates layers for the formation of a pFET (layers 112, 114 and 117) stacked on top of layers for the formation of an nFET (layers 102, 104 and 107). In an alternative embodiment, polarities may be reversed such that an nFET is stacked on a pFET.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD), vapor-phase epitaxy (VPE), liquid-phase epitaxy (LPE), and molecular beam epitaxy (MBE). The temperature for an epitaxial deposition process can range from 500° C. to 900° C. Although higher temperature typically results in faster deposition, the faster deposition may result in crystal defects and film cracking.

A number of different sources may be used for the epitaxial growth of the compressively strained layer. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, ldisilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof, while an epitaxial silicon germanium alloy layer can be formed utilizing a combination of such gas sources. Carrier gases like hydrogen, nitrogen, helium and argon can be used. In connection with epitaxial growth of the REO isolation layer 108 a variety of methods, such as, for example, UHVCVD, RTCVD, metalorganic chemical vapor deposition (MOCVD), low-pressure chemical vapor deposition (LPCVD), limited reaction processing CVD (LRPCVD), and MBE, can be used to form the REO isolation layer 108. In some embodiments, the REO isolation layer 108 can be epitaxially grown from gaseous or liquid precursors.

Figure 2:
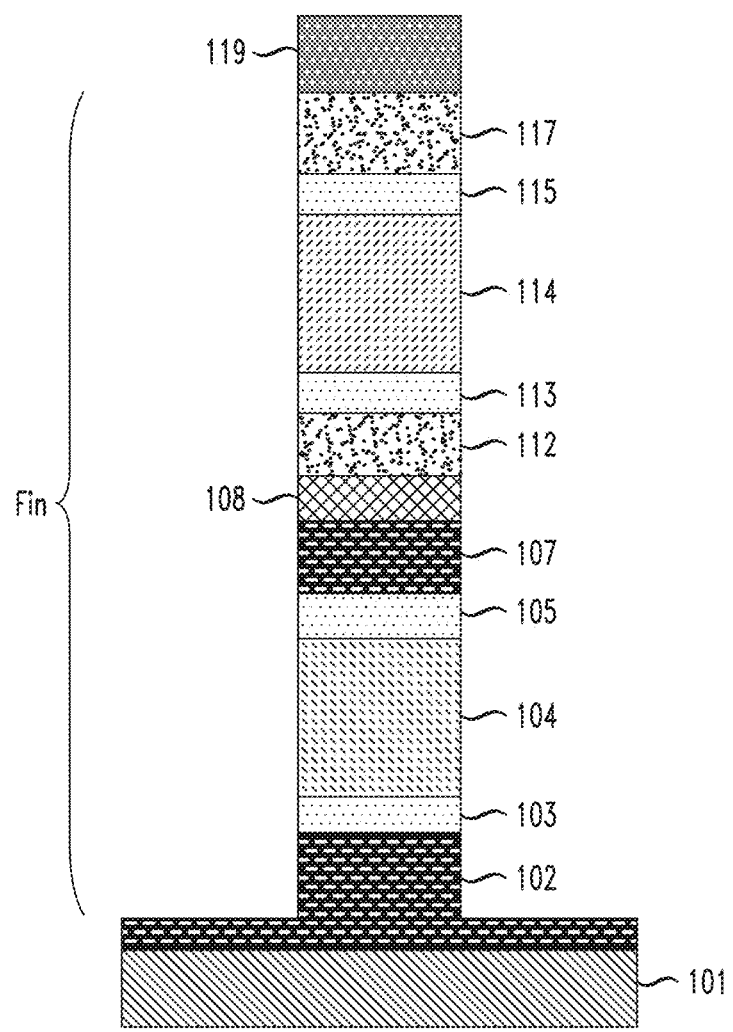
FIG. 2 is a cross-sectional view illustrating fin formation in a method of manufacturing a semiconductor device, according to an exemplary embodiment of the present invention.

FIG. 2 is a cross-sectional view illustrating fin formation in a method of manufacturing a semiconductor device, according to an exemplary embodiment of the present invention. Referring to FIG. 2, exposed portions of the layers 102, 103, 104, 105, 107, 108, 112, 113, 114, 115 and 117 not protected by the hardmask 119 are removed down through part of the first doped layer 102 using an etch process, such as, for example, an anisotropic etch process, including, but not limited to, a reactive ion etch (RIE) process. As can be seen, the resulting structure of the fin includes parts of layers 102, 103, 104, 105, 107, 108, 112, 113, 114, 115 and 117 under the hardmask 119. A lateral width of the fin is in the range of about 20 nm to about 25 nm, but is not necessarily limited thereto. While embodiments of the present invention describe a fin, the embodiments are not necessarily limited thereto, and may include nanowire regions. The drawings illustrate one fin on the substrate 101. Although one fin is shown in the figures for ease of explanation, more than one fin can be formed.

Figure 3:
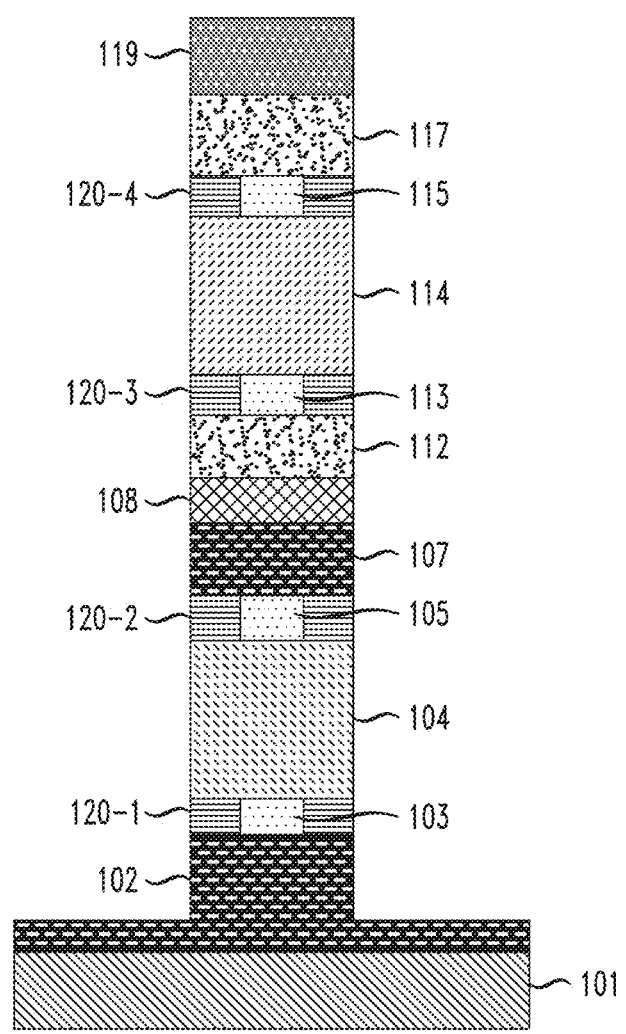
FIG. 3 is a cross-sectional view illustrating recessing of silicon germanium layers and spacer formation in a method of manufacturing a semiconductor device, according to an exemplary embodiment of the present invention.

Referring to FIG. 3, the sacrificial layers 103, 105, 113 and 115, which include, for example SiGe (e.g., SiGe25) are selectively laterally etched with respect to layers 102, 104, 107, 108, 112, 114, 117 and 119, such that the side portions of the sacrificial layers 103, 105, 113 and 115 can be removed to create vacant areas, while maintaining the side portions of layers 102, 104, 107, 108, 112, 114, 117 and 119. As can be seen, the lateral side surfaces of the sacrificial layers 103, 105, 113 and 115 are recessed with respect to the lateral side surfaces of layers 102, 104, 107, 108, 112, 114, 117 and 119. The etching can be performed using, for example, a vapor etch. The vapor etch can include using gas phase hydrogen chloride (HCl) in some embodiments. In a non-limiting example, the sacrificial layers 103, 105, 113 and 115 are etched to a lateral width of about 5 nm to about 10 nm, but the embodiments are not necessarily limited thereto.

The vacant areas adjacent the remaining portions of the sacrificial layers 103, 105, 113 and 115 are filled in with first inner spacers 120-1, 120-2, 120-3 and 120-4. According to an embodiment, a first inner spacer layer is deposited in the vacant areas adjacent the remaining portions of the sacrificial layers 103, 105, 113 and 115, and on top and side surfaces of the fin, as well on exposed surfaces of the first doped layer 102. The first inner spacer layer can be deposited using a conformal deposition technique such as, for example, atomic layer deposition (ALD) or chemical vapor deposition (CVD) followed by an etch process such as RIE to remove excess portions of the first inner spacer layer from top and side surfaces of the fin and from exposed surfaces of the first doped layer 102 to form the first inner spacers 120-1, 120-2, 120-3 and 120-4 in the vacant areas. In accordance with an embodiment, the first inner spacers 120-1, 120-2, 120-3 and 120-4 can comprise, but are not necessarily limited to, a dielectric, for example, oxide spacer materials such as $SiO_2$ and/or silicon oxycarbide (SiOC), and/or nitride spacer materials such as silicon nitride (SiN), silicon-boron-nitride (SiBN), siliconborocarbonitride (SiBCN) and/or silicon oxycarbonitride (SiOCN).

Figure 4:
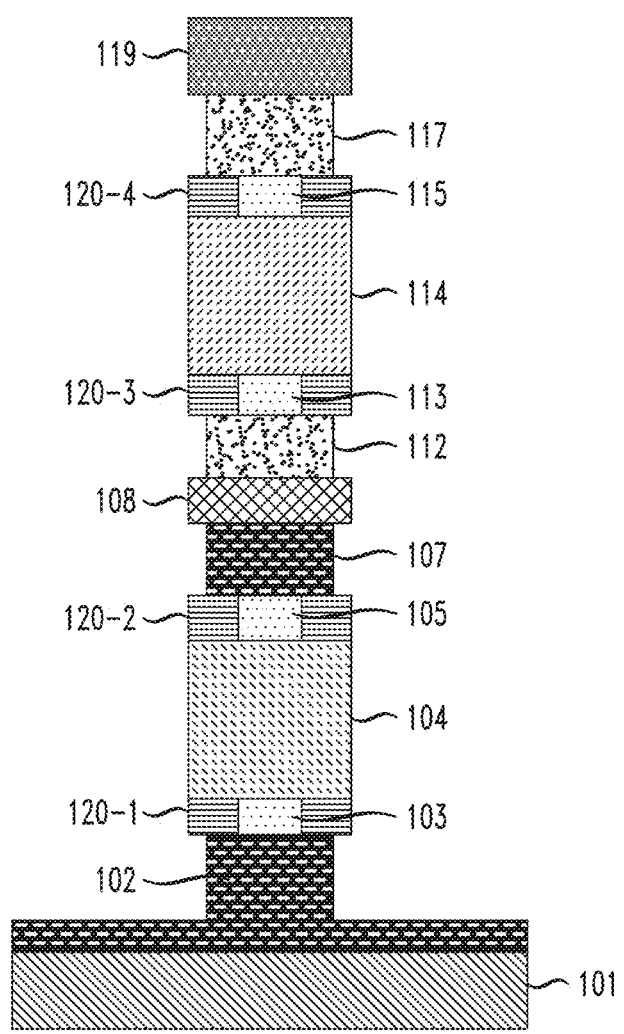
FIG. 4 is a cross-sectional view illustrating lateral etching of doped semiconductor layers in a method of manufacturing a semiconductor device, according to an exemplary embodiment of the present invention.

Referring to FIG. 4, following formation of the first inner spacers 120-1, 120-2, 120-3 and 120-4, the first, second, third and fourth doped semiconductor layers 102, 107, 112 and 117, which include, for example doped Si, are selectively laterally etched such that the side portions of the doped semiconductor layers 102, 107, 112 and 117 are removed to create vacant areas, while maintaining un-etched side portions of first inner spacers 120-1, 120-2, 120-3 and 120-4, and of layers 104, 108, 114 and 119. As can be seen, the lateral side surfaces of the first, second, third and fourth doped semiconductor layers 102, 107, 112 and 117 are recessed with respect to the lateral side surfaces of first inner spacers 120-1, 120-2, 120-3 and 120-4, and of layers 104, 108, 114 and 119. The etching can be performed using, for example, a wet etch solution containing ammonia or tetramethylammonium hydroxide (TMAH), or a plasma dry etch. Alternatively, the recessing can be performed by oxidation and then removal of the resulting oxide, or by direct or atomic layer etching where a repetitive fixed amount of material is removed. In a non-limiting example, the doped semiconductor layers 102, 107, 112 and 117 are etched to a lateral width of about 20 nm to about 30 nm, but the embodiments are not necessarily limited thereto.

Figure 5:
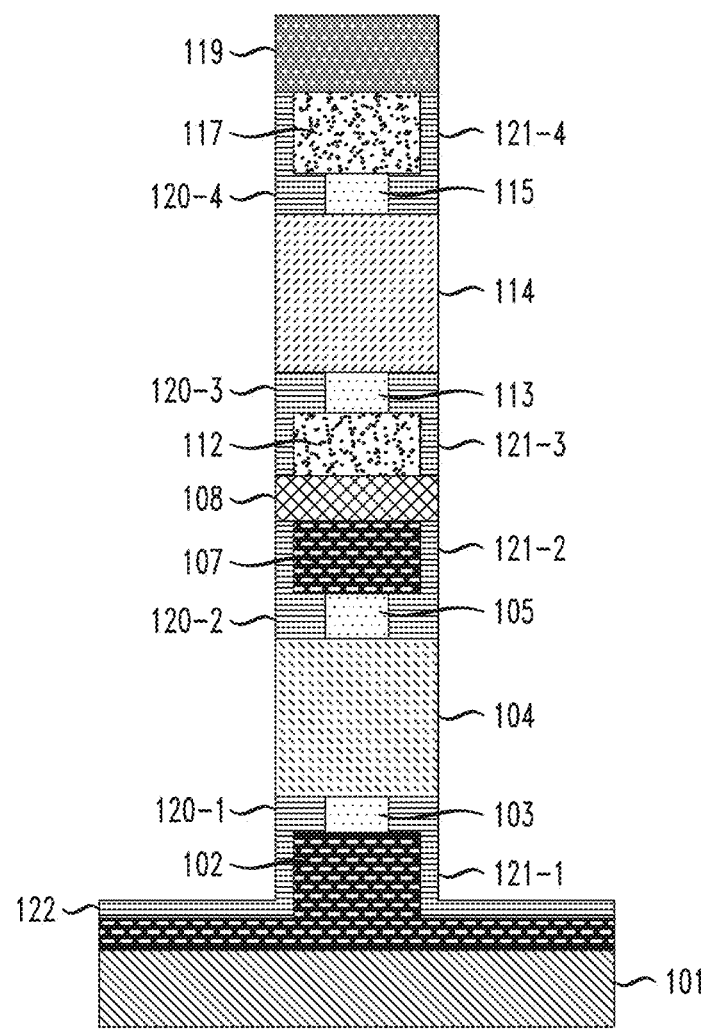
FIG. 5 is a cross-sectional view illustrating spacer formation in a method of manufacturing a semiconductor device, according to an exemplary embodiment of the present invention.

Referring to FIG. 5, the vacant areas adjacent the remaining portions of the doped semiconductor layers 102, 107, 112 and 117 are filled in with second inner spacers 121-1, 121-2, 121-3 and 121-4. According to an embodiment, a second inner spacer layer is deposited in the vacant areas adjacent the remaining portions of the doped semiconductor layers 102, 107, 112 and 117, and on top and side surfaces of the fin, as well on exposed surfaces of the first doped layer 102. The second inner spacer layer can be deposited using a conformal deposition technique such as, for example, ALD or CVD followed by an etch process such as RIE to remove excess portions of the second inner spacer layer from top and side surfaces of the fin and from exposed surfaces of the first doped layer 102 to form the second inner spacers 121-1, 121-2, 121-3 and 121-4 in the vacant areas. In accordance with an embodiment, the second inner spacers 121-1, 121-2, 121-3 and 121-4 can comprise the same or similar material as that of the first inner spacers 120-1, 120-2, 120-3 and 120-4, such as, but not necessarily limited to, the above noted oxide and/or nitride spacer materials.

Following formation of the second inner spacers 121-1, 121-2, 121-3 and 121-4, a bottom spacer layer 122 is formed on the exposed surfaces of the first doped layer 102 by directional deposition. Directional deposition techniques include, for example, high density plasma (HDP) deposition and gas cluster ion beam (GCIB) deposition. In accordance with an embodiment, the bottom spacer layer 122 can comprise the same or similar material as that of the first and/or second inner spacers 120-1 to 120-4 and 121-1 to 121-4, such as, but not necessarily limited to, the above-noted oxide and/or nitride spacer materials.

Figure 6:
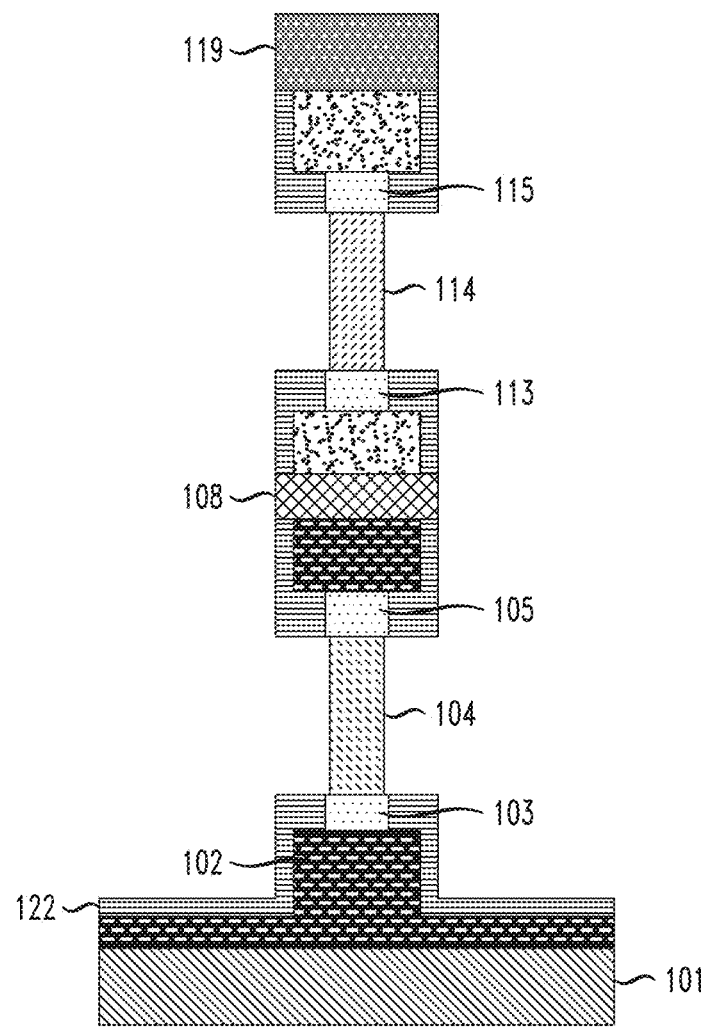
FIG. 6 is a cross-sectional view illustrating channel layer trimming in a method of manufacturing a semiconductor device, according to an exemplary embodiment of the present invention.

Referring to FIG. 6, the exposed sides of the undoped semiconductor layers 104 and 114, which are not covered by dielectric material (e.g., not covered by the first or second inner spacers 120-1 to 120-4 and 121-1 to 121-4 or the bottom spacer layer 122) are laterally etched such that the side portions of the undoped semiconductor layers 104 and 114 are removed to reduce a lateral width of the layers 104 and 114. The etching can be performed using, for example, a wet or dry etch process including, for example, TMAH or potassium hydroxide (KOH), which does not etch the spacers 120-1 to 120-4, 121-1 to 121-4 and 122, or the layers 108 and 119. In a non-limiting example, the 104 and 114 are etched to a lateral width of about 8 nm to about 10 nm.

Figure 7:
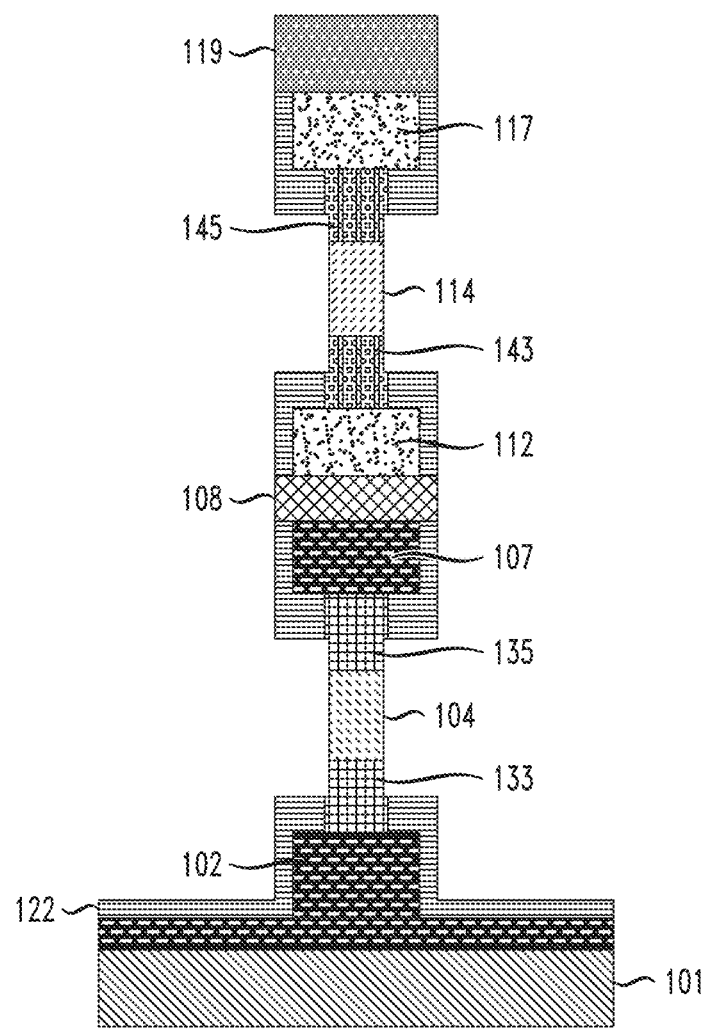
FIG. 7 is a cross-sectional view illustrating source/drain junction formation in a method of manufacturing a semiconductor device, according to an exemplary embodiment of the present invention.

Referring to FIG. 7, source/drain junction regions 133, 135, 143 and 145 between the source/drain regions (i.e., doped layers 102, 107, 112 and 117) and the channel regions (i.e., undoped layers 104 and 114) are formed by an annealing process, which causes dopant diffusion from the doped layers 102, 107, 112 and 117 into the layers 103, 105, 113 and 115 (e.g., SiGe layers), respectively, and parts of the undoped layers 104 and 114 adjacent the layers 103, 105, 113 and 115. The resulting junction regions 133 and 135 for the lower transistor (e.g., nFET) include the portions formerly labeled as 103 and 105, and the resulting junction regions 143 and 145 for the upper transistor (e.g., pFET) include the portions formerly labeled as 113 and 115. The portions formerly labeled as 103, 105, 113 and 115 retain the same shape and include SiGe, but after diffusion also include the diffused dopant. Similarly, end portions of the layers 104 and 114 adjacent the layers 103, 105, 113 and 115 include Si, but after diffusion also include the diffused dopant. A doping concentration can be higher at areas of the junction regions 133, 135, 143 and 145 closer to the doped layers 102, 107, 112 and 117 than at areas of the junction regions 133, 135, 143, 145 farther away from the doped layers 102, 107, 112 and 117. The annealing process can be, for example, a drive-in annealing process performed at temperatures in the range of, for example, about 800° C. to about 1300° C. and for durations in the range of, for example, about 0.01 seconds to 10 minutes.

Figure 8:
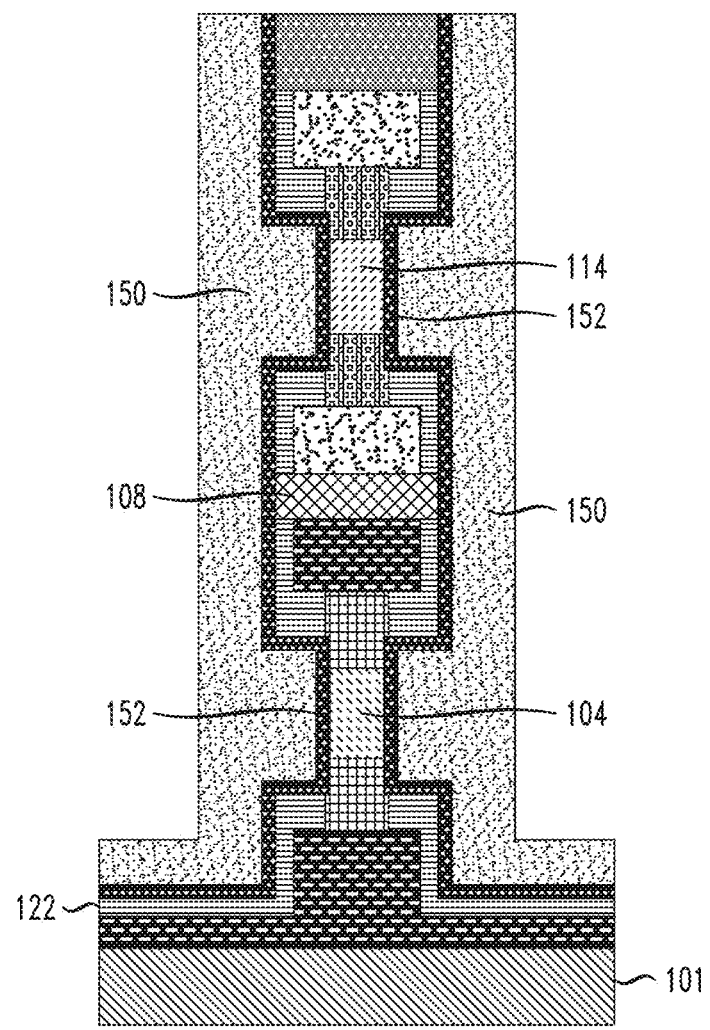
FIG. 8 is a cross-sectional view illustrating gate dielectric and n-type gate metal formation in a method of manufacturing a semiconductor device, according to an exemplary embodiment of the present invention.

Referring to FIG. 8, gate dielectric and first type (e.g., n-type) gate metal layers 152 and 150 are conformally deposited on the structure of FIG. 7. The gate dielectric layers 152 include, for example, a high-K material including, but not necessarily limited to, $HfO_2$ (hafnium oxide), $ZrO_2$ (zirconium dioxide), hafnium zirconium oxide, $Al_2O_3$ (aluminum oxide), and $Ta_2O_5$ (tantalum pentoxide). The first type gate metal layers 150 are n-type work function metal (WFM) layers including, but not necessarily limited to, titanium nitride (TiN), titanium aluminum nitride (TiAlN), titanium aluminum carbon nitride (TiAlCN), titanium carbide (TiC), titanium aluminum carbide (TiAlC), tantalum aluminum carbide (TaAlC), tantalum aluminum carbon nitride (TaAlCN) or lanthanum (La) doped TiN, TaN. The gate dielectric and n-type gate metal layers 152 and 150 are deposited using, for example, conformal deposition techniques including, but not limited to, ALD or CVD followed by planarization, such as, for example, chemical mechanical polishing (CMP), to remove excess portions of the gate dielectric and WFM layers 152 and 150 from an upper surface of the hardmask 119.

As can be seen, the gate dielectric layers 152 are deposited on exposed surfaces of the bottom spacer layer 122, the inner spacers 120-1 to 120-4 and 121-1 to 121-4, the junction regions 133, 135, 143, 145, the undoped layers 104 and 114, the isolation layer 108 and the hardmask 119, and the gate metal layer 150 is deposited on the exposed surfaces of the gate dielectric layer 152. The gate dielectric and gate metal layers 152 and 150 fill in areas formerly occupied by the removed portions of the undoped layers 104 and 114.

Figure 9:
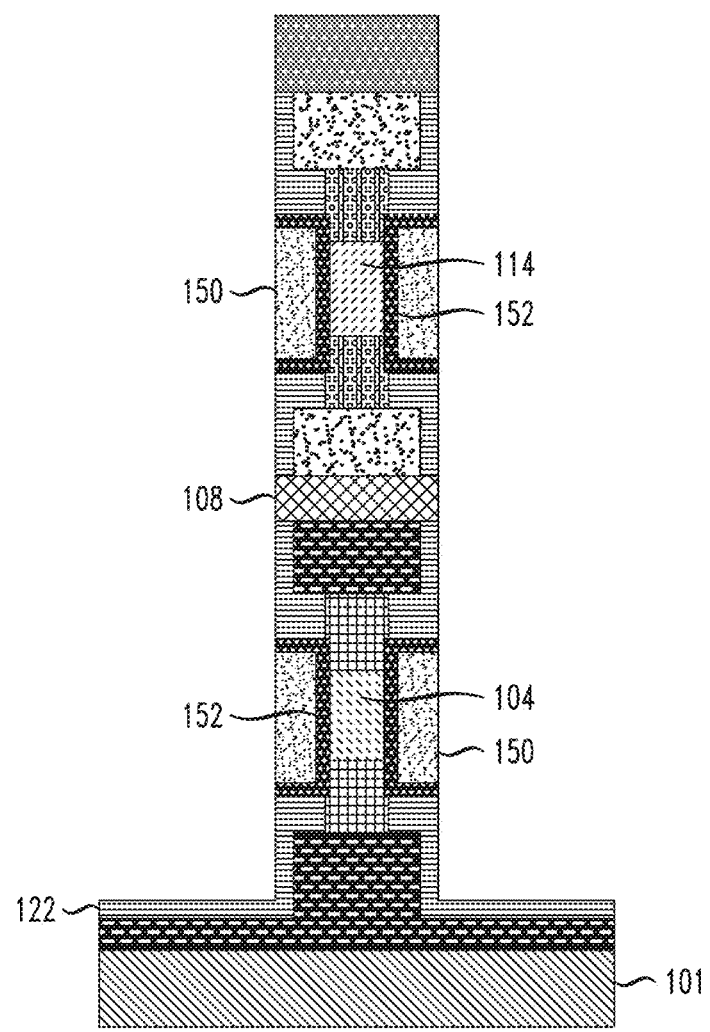
FIG. 9 is a cross-sectional view illustrating n-type gate metal recessing and removal of portions of the deposited gate dielectric in a method of manufacturing a semiconductor device, according to an exemplary embodiment of the present invention.

Referring to FIG. 9, directional RIE is performed to remove portions of the gate metal layer 150 from the bottom spacer layer 122, the inner spacers 120-1 to 120-4 and 121-1 to 121-4 and the hardmask 119. The directional RIE is performed using, for example, chlorine-based gases (e.g., various mixtures of $Cl_2$ gas with oxygen, nitrogen, helium and/or argon) and/or fluorine-based gases (e.g., $SF_6$, $CF_4$, $CHF_3$ or $C_4F_8$). The directional ME can also remove horizontal portions of the gate dielectric layer 152 from the bottom spacer layer 122. A high-k isotropic etch using, for example, diluted HF solution, is then performed to remove vertical portions of the gate dielectric layer 152 from the inner spacers 120-1 to 120-4 and 121-1 to 121-4 and the hardmask 119, which were exposed after the directional RIE removing the portions of the gate metal layer 150. As can be seen in FIG. 9, the gate dielectric and gate metal layers 152 and 150 remain in the areas formerly occupied by the removed portions of the undoped layers 104 and 114.

Figure 10:
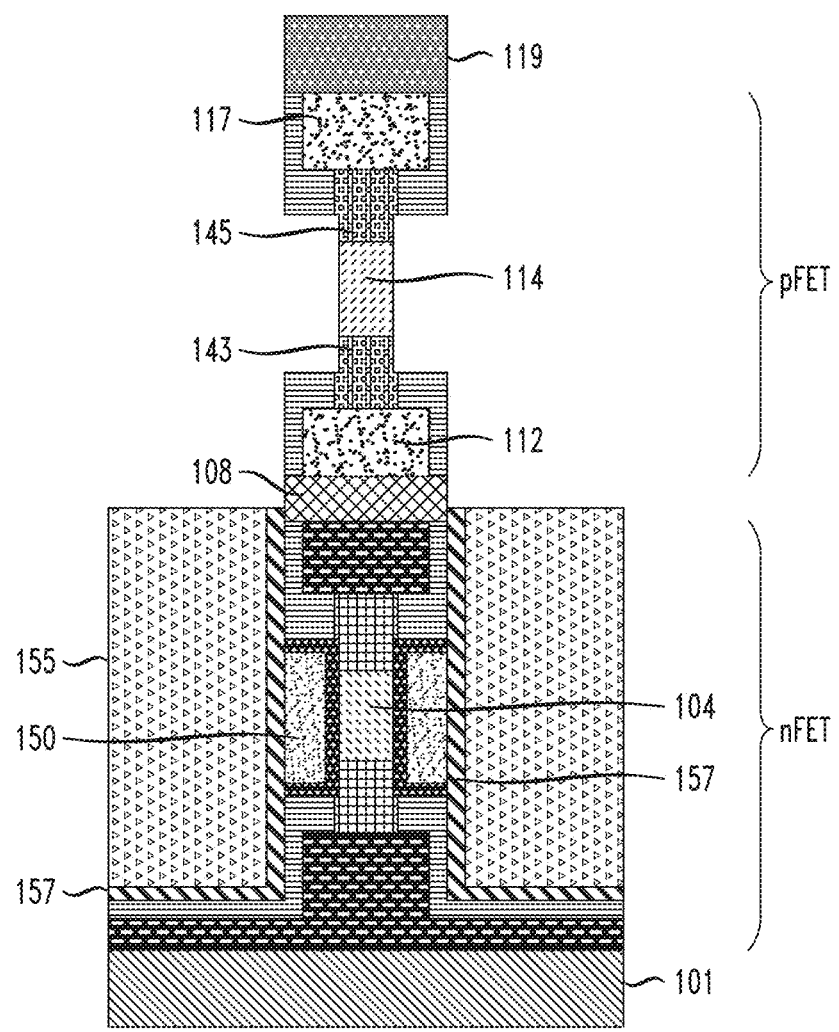
FIG. 10 is a cross-sectional view illustrating dielectric liner and dielectric layer deposition and recessing, and removal of the gate dielectric and n-type gate metal from a pFET region in a method of manufacturing a semiconductor device, according to an exemplary embodiment of the present invention.

Referring to FIG. 10, a dielectric liner layer 157 is conformally deposited on the structure of FIG. 9 including on the top surface of the bottom spacer layer 122, the side surfaces of the inner spacers 120-1 to 120-4 and 121-1 to 121-4, the side surfaces of the gate metal and gate dielectric layers 150 and 152 and top and side surfaces of the hardmask 119. According to an embodiment, the dielectric liner layer 157 includes, for example, SiN or other material, such as, but not necessarily limited to, SiBN, SiBCN or SiOCN, and is deposited using, for example, ALD or CVD. Following deposition of the liner layer 157, a dielectric layer 155 is deposited on the liner layer 157. The dielectric layer 155 comprises, for example, an oxide, such as, but not necessarily limited to, silicon oxide ($SiO_x$), where x is, for example, 2, 1.99 or 2.01, or carbon-doped silicon oxide (SiCO). The dielectric layer 155 can be deposited using a deposition technique such as, but not necessarily limited to, CVD, plasma-enhanced CVD (PECVD), radio-frequency CVD (RFCVD), physical vapor deposition (PVD), ALD, molecular layer deposition (MLD), molecular beam deposition (MBD), pulsed laser deposition (PLD), liquid source misted chemical deposition (LSMCD), sputtering and/or plating. Dielectric layer deposition is followed by a planarization process, such as, for example, CMP to remove excess dielectric layer and liner layer material down to the hardmask 119.

Following dielectric layer deposition and planarization, the dielectric and liner layers 155 and 157 are recessed down to the nFET region to a height which is level with or approximately level with a middle of the isolation layer 108 in the vertical direction. In accordance with an embodiment, if the dielectric layer 155 is silicon oxide, a wet etch employing hydrofluoric acid (HF) or a vapor etch employing a vapor of HF can be used to recess the dielectric layer 155. The etch of the dielectric layer 155 can be selective to the liner layer 157 so that the dielectric liner layer 157 is not etched during removal of the dielectric layer 155 so as not to expose the top transistor portion. Then, the exposed portion of the dielectric liner 157 (for example, SiN) is removed with a wet etch employing a combination of ethylene glycol and HF. The duration of the isotropic etch for dielectric liner layer 157 can be timed such that the it will not attack the underlying spacer layers 120-3, 120-4, 121-3 and 121-4 if layers 120-3, 120-4, 121-3 and 121-4 are also silicon nitride.

Following removal of the dielectric and liner layers 155 and 157 from the pFET region, the gate dielectric layers 152 and the n-type gate metal layers 150 are removed from the pFET region. The removal of the gate dielectric layers 152 and the n-type gate metal layers 150 is performed using a non-directional (i.e., isotropic) etching process such as a wet chemical etch like SC1 ($NH_4OH:H_2O_2:H_2O$). A high-k isotropic wet etch using, for example, diluted HF solution, is then performed to remove remaining portions of the gate dielectric layer 152 from the pFET region. The gate dielectric layers 152 and the n-type gate metal layers 150 form a gate region around the undoped layer 104 (e.g., n-channel region of an nFET).

Figure 11:
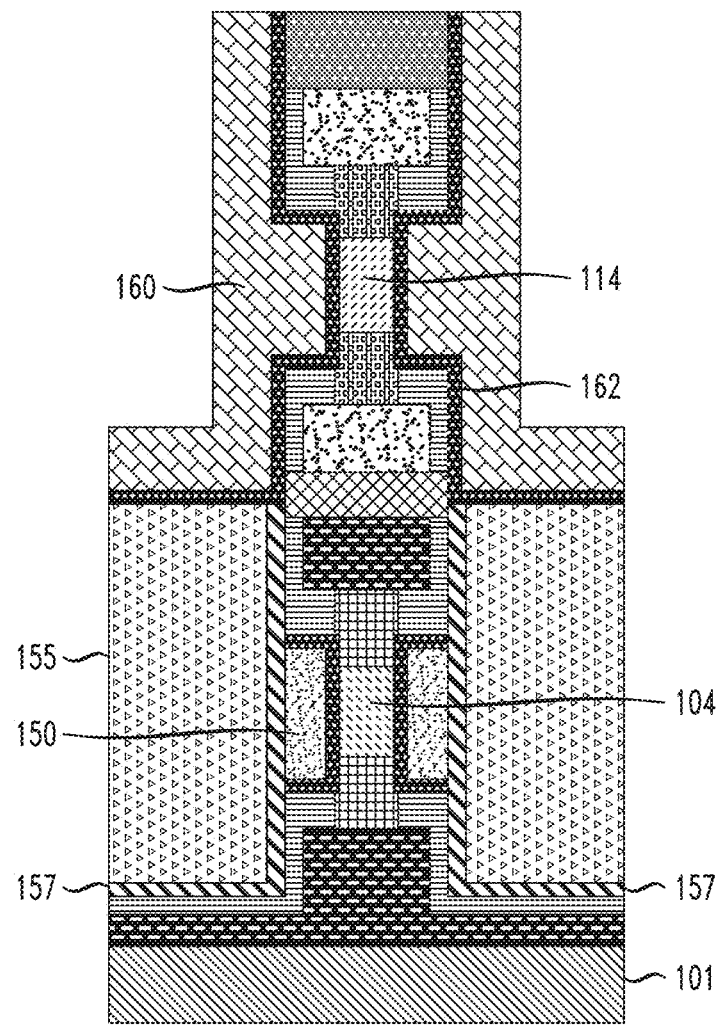
FIG. 11 is a cross-sectional view illustrating gate dielectric and p-type gate metal formation in the pFET region in a method of manufacturing a semiconductor device, according to an exemplary embodiment of the present invention.

Referring to FIG. 11, gate dielectric and second type (e.g., p-type) gate metal layers 162 and 160 are conformally deposited in the pFET region on the structure of FIG. 10. The gate dielectric layers 162 include, for example, a high-K material including, but not necessarily limited to, the same or similar materials as those of the gate dielectric layer 152. The second type gate metal layers 160 are p-type WFM layers including, but not limited to, TiN, TaN or ruthenium (Ru). The gate dielectric and p-type gate metal layers 162 and 160 are deposited using, for example, conformal deposition techniques including, but not limited to, ALD or CVD followed by planarization, such as, for example, CMP, to remove excess portions of the gate dielectric and WFM layers 162 and 160 from an upper surface of the hardmask 119.

As can be seen, the gate dielectric layers 162 are deposited on exposed surfaces of the dielectric and dielectric liner layers 155 and 157, the inner spacers 120-3 to 120-4 and 121-3 to 121-4, the junction regions 143, 145, the undoped layer 114, the isolation layer 108 and the hardmask 119. The gate metal layer 160 is deposited on the exposed surfaces of the gate dielectric layer 162. The gate dielectric and gate metal layers 162 and 160 fill in areas where the gate metal and gate dielectric layers 150 and 152 were removed from the pFET region (e.g., areas formerly occupied by the removed portions of the undoped layers 114).

According to an embodiment, the gate metal layer 150 is an n-type WFM layer, and the gate metal layer 160 is a p-type WFM layer. Alternatively, if the polarities of the upper and lower transistors were reversed and an nFET was stacked on a pFET instead of a pFET being stacked on an nFET, the deposited gate metal layers 150 and 160 would be p-type and n-type, respectively.

Figure 12:
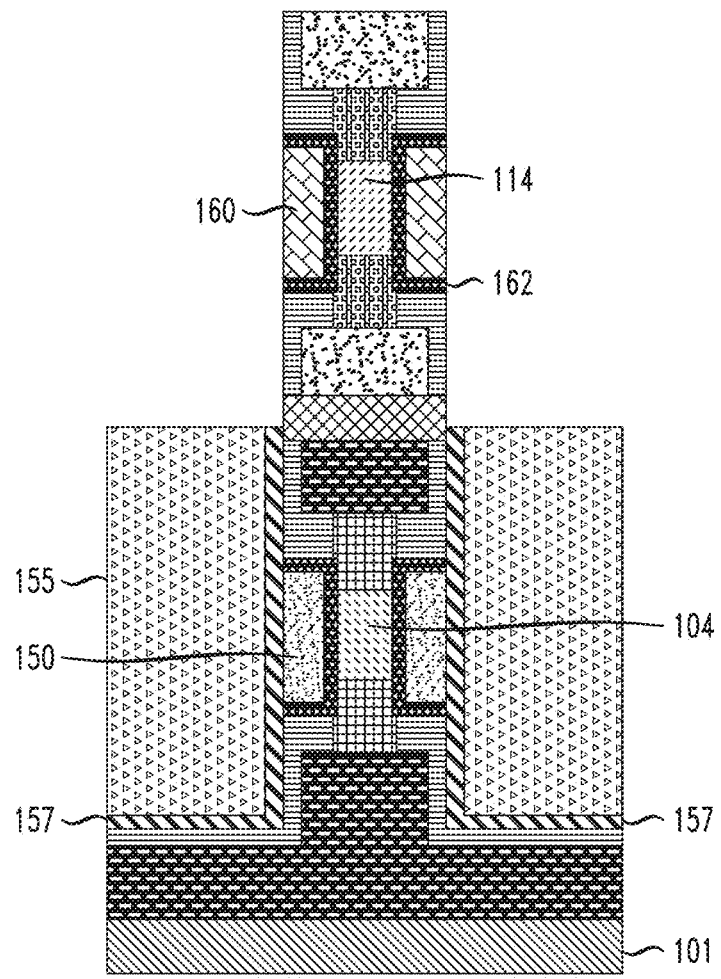
FIG. 12 is a cross-sectional view illustrating p-type gate metal recessing and removal of portions of the deposited gate dielectric in the pFET region in a method of manufacturing a semiconductor device, according to an exemplary embodiment of the present invention.

Referring to FIG. 12, directional ME is performed to remove portions of the gate metal layer 160 from the dielectric and dielectric liner layers 155 and 157, the inner spacers 120-3 to 120-4 and 121-3 to 121-4 and the hardmask 119. The directional RIE is performed using, for example, chlorine-based gases (e.g., various mixtures of $Cl_2$ gas with oxygen, nitrogen, helium and/or argon) and/or fluorine-based gases (e.g., $SF_6$, $CF_4$, $CHF_3$ or $C_4F_8$). The directional ME can also remove horizontal portions of the gate dielectric layer 162 from the dielectric and dielectric liner layers 155 and 157. A high-k isotropic wet etch using, for example, diluted HF solution, is then performed to remove vertical portions of the gate dielectric layer 162 from the inner spacers 120-3 to 120-4 and 121-3 to 121-4 and the hardmask 119, which were exposed after the directional RIE removing the portions of the gate metal layer 160. As can be seen in FIG. 12, the gate dielectric and gate metal layers 162 and 160 remain in the areas where the gate metal and gate dielectric layers 150 and 152 were removed from the pFET region (e.g., areas formerly occupied by the removed portions of the undoped layers 114). The gate dielectric layers 162 and the p-type gate metal layers 160 form a gate region around the undoped layer 114 (e.g., p-channel region of a pFET).

Figure 13:
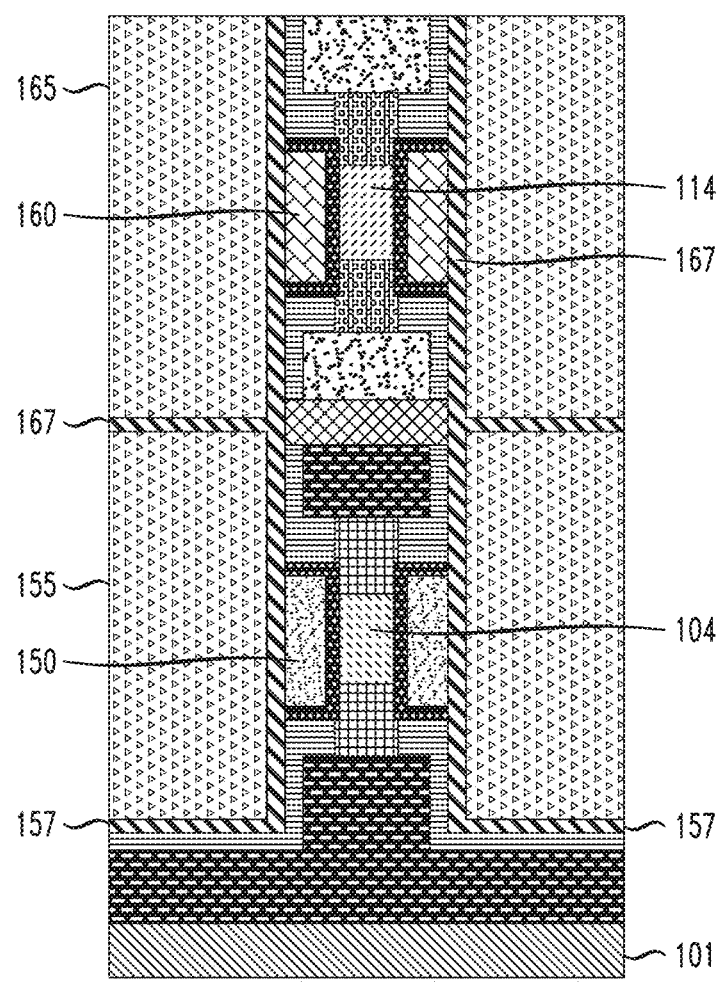
FIG. 13 is a cross-sectional view illustrating dielectric liner and dielectric layer deposition in the pFET region in a method of manufacturing a semiconductor device, according to an exemplary embodiment of the present invention.

Referring to FIG. 13, a dielectric liner layer 167 is conformally deposited on the structure of FIG. 12 including on the top surfaces of the dielectric and dielectric liner layers 155 and 157, the side surfaces of the inner spacers 120-3 to 120-4 and 121-3 to 121-4, the side surfaces of the gate metal and gate dielectric layers 160 and 162 and top and side surfaces of the hardmask 119. According to an embodiment, the dielectric liner layer 167 includes the same or similar material as the dielectric liner layer 157, and is deposited using, for example, ALD or CVD. Following deposition of the liner layer 167, a dielectric layer 165 is deposited on the liner layer 167. The dielectric layer 165 comprises, for example, the same or similar material as the dielectric layer 155. The dielectric layer 165 can be deposited using a deposition technique such as, but not necessarily limited to, CVD, PECVD, RFCVD, PVD, ALD, MLD, MBD, PLD, LSMCD, sputtering and/or plating. Dielectric layer deposition is followed by a planarization process, such as, for example, CMP to remove the hardmask 119, and excess dielectric layer and liner layer material down to the upper source/drain region 117 of the upper transistor (e.g., pFET).

Figure 14:
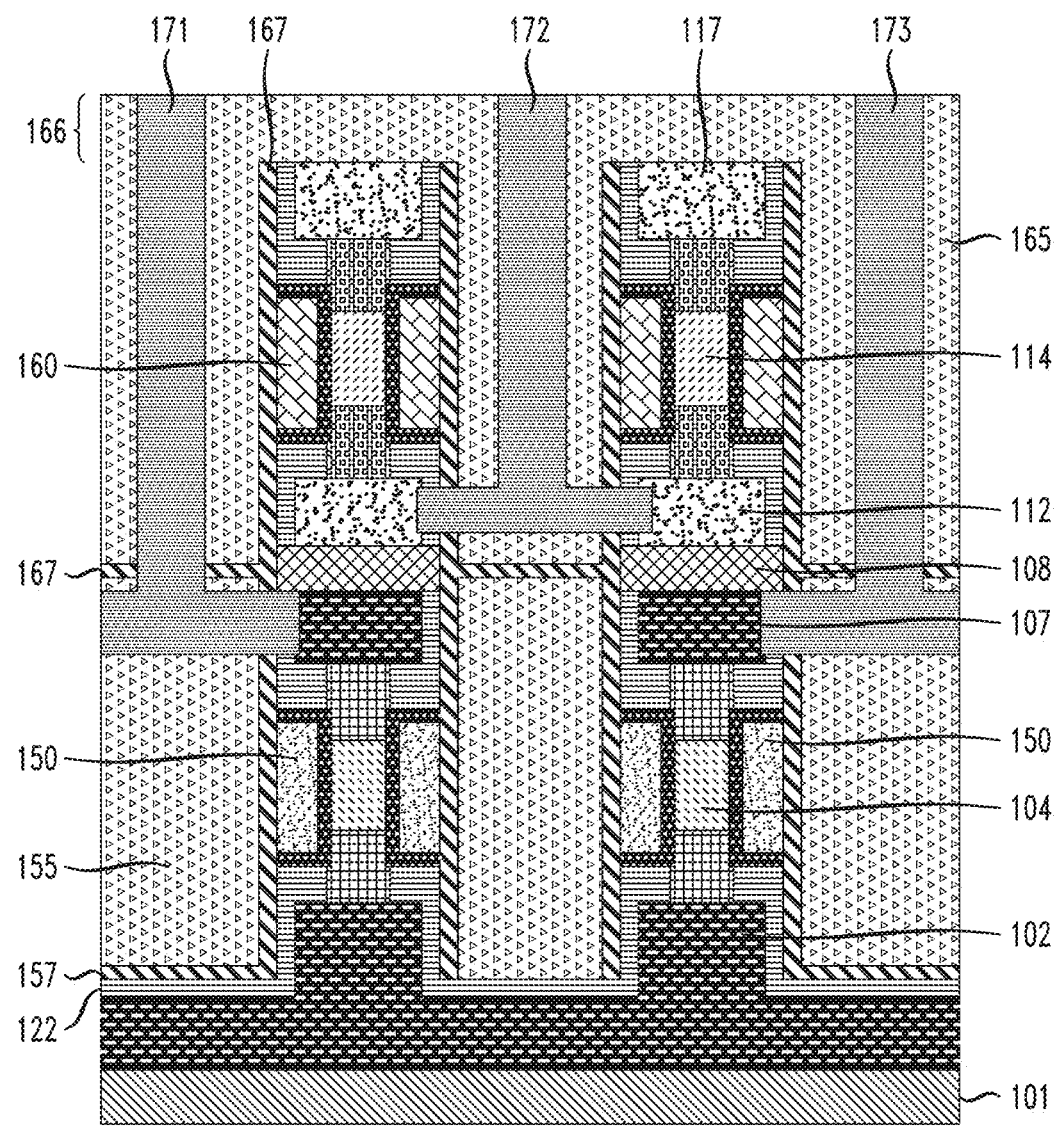
FIG. 14 is a cross-sectional view illustrating bottom source/drain contact formation to upper transistors and top source/drain contact formation to lower transistors of transistor stacks, in a method of manufacturing a semiconductor device, according to an exemplary embodiment of the present invention.
Figure 15:
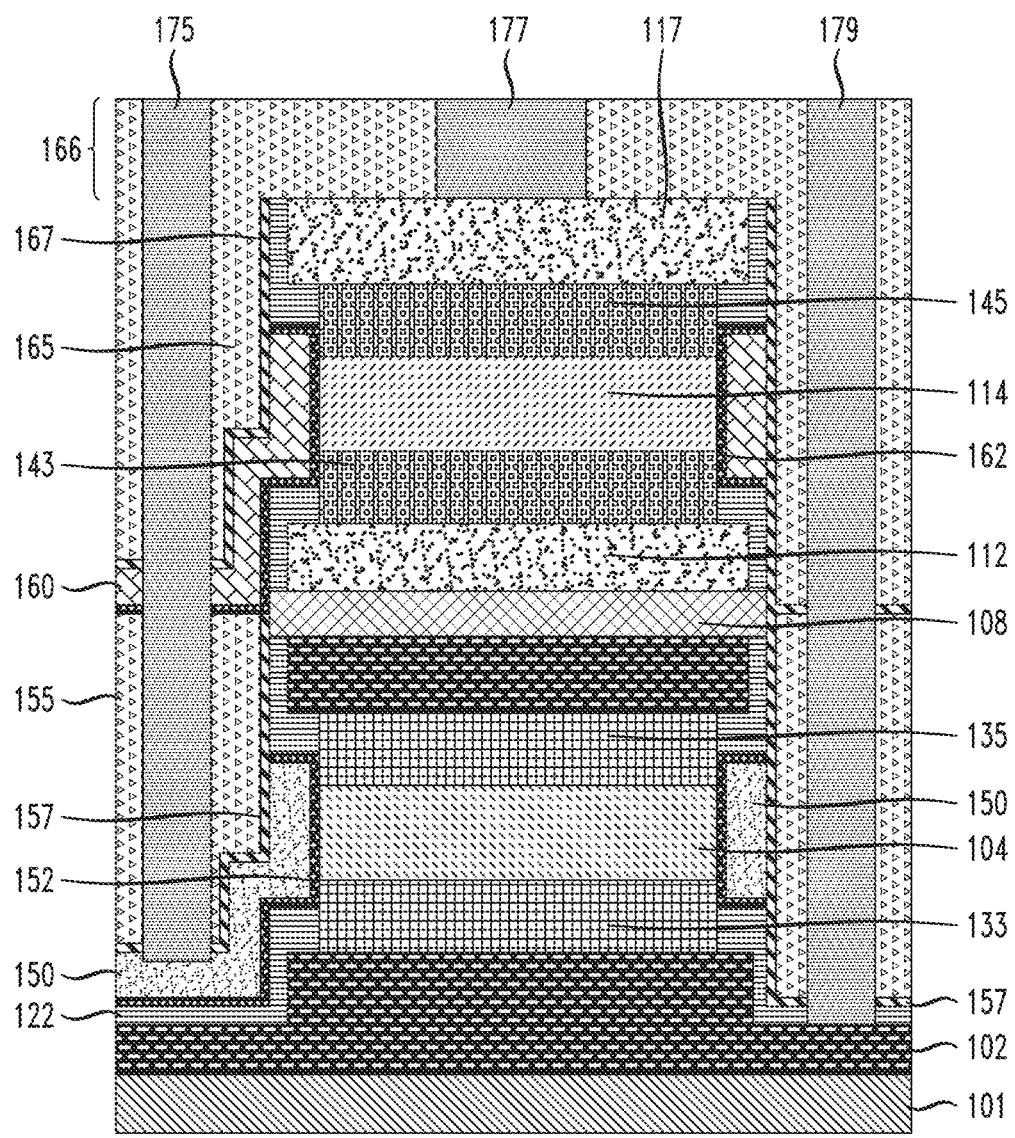
FIG. 15 is a cross-sectional view illustrating bottom source/drain contact formation to a lower transistor, top source/drain contact formation to an upper transistor, and gate contact formation to upper and lower transistors of a transistor stack, in a method of manufacturing a semiconductor device, according to an exemplary embodiment of the present invention.

Referring to FIG. 14, two transistor stacks are shown side-by-side on a substrate 101. Instead of one transistor stack as described in connection with FIGS. 1-13, FIG. 14 illustrates two of the nFET and pFET vertical transistor stacks manufactured pursuant to the processing described in connection with FIGS. 1-13. For ease of explanation, FIG. 14 uses the same reference numerals as FIGS. 1-13 to illustrate the same elements.

As shown in FIG. 14, there has been a further deposition of a dielectric layer 166 on the transistor stack structures to increase the height of the dielectric layer to be above the top surface of the upper source/drain regions 117 of the upper transistors (e.g., pFETs). The dielectric layer 166 comprises, for example, the same or similar material as the dielectric layer 165. FIG. 14 illustrates a source/drain contact 172 to the third doped layers 112 (e.g., bottom source/drain regions) of the upper transistors (e.g., pFETs) and source/drain contacts 171 and 173 to second doped layers 107 (e.g., top source/drain regions) of the lower transistors (e.g., nFETs) of the transistor stacks.

Using, for example, lithography followed by RIE, trenches are respectively opened in the dielectric layers 166, 165 and/or 155 to form contacts 171, 172 and 173. For example, contacts 171 and 173 to the second doped layers 107 are formed in trenches through the dielectric layers 166, 165 and 155, and through the dielectric liner layers 167 and 157, and contact 172 to the third doped layers 112 is formed in a trench through the dielectric layers 166 and 165.

Contacts 171, 172 and 173 are formed in the trenches by filling the trenches with contact material, such as, for example, electrically conductive material including, but not necessarily limited to, tungsten, cobalt, zirconium, tantalum, titanium, aluminum, ruthenium, and/or copper. A liner layer (not shown) including, for example, titanium and/or titanium nitride, may be formed to line surfaces of the trenches before filling the trenches with the contact material layers. Deposition of the contact material layers can be performed using one or more deposition techniques, including, but not necessarily limited to, CVD, PECVD, PVD, ALD, MBD, PLD, LSMCD, and/or spin-on coating, followed by planarization using a planarization process, such as, for example, CMP.

FIG. 15 is a cross-sectional view taken parallel to a fin length extension direction (e.g., a length of the fin extends in left and right directions on the page), and illustrating a single transistor stack of an upper vertical transport transistor (e.g., pFET) on a lower vertical transport transistor (e.g., nFET). FIG. 15 illustrates the stacked structure formed by the processing in FIGS. 1-13 in a different cross-sectional view than those of FIGS. 1-13, and with source/drain and gate contacts.

Similar to FIG. 14, as shown in FIG. 15, there has been a further deposition of a dielectric layer 166 on the transistor stack structure to increase the height of the dielectric layer to be above the top surface of the upper source/drain region 117 of the upper transistor (e.g., pFET). The dielectric layer 166 comprises, for example, the same or similar material as the dielectric layer 165. FIG. 15 illustrates a contact 179 to the first doped layer 102 (e.g., bottom source/drain region of the lower transistor), a contact 177 to the fourth doped layer 117 (e.g., top source/drain region of the upper transistor), and a gate contact 175 to metal layers 160 and 150 (e.g., gate regions of the upper and lower transistors, respectively).

Using, for example, lithography followed by RIE, trenches are respectively opened in the dielectric layers 166, 165 and/or 155 to form contacts 175, 177 and 179. For example, contact 175 to the gate metal layers 160 and 150 is formed in a trench through the dielectric layers 166, 165 and 155, and through the dielectric liner layers 167 and 157, and the gate dielectric layer 162. Contact 177 to the fourth doped layer 117 is formed in a trench through the dielectric layer 166, and contact 179 to the first doped layer 112 is formed in a trench through the dielectric layers 166, 165 and 155, and through the dielectric liner layers 167 and 157, and the bottom spacer layer 122.

Similar to contacts 171, 172 and 173, contacts 175, 177 and 179 are formed in the trenches by filling the trenches with the same or similar contact material as that described in connection with contacts 171, 172 and 173. In addition, a liner layer (not shown) like the liner layer described in connection with contacts 171, 172 and 173 may be formed to line surfaces of the trenches for contacts 175, 177 and 179 before filling the trenches with the contact material layers. Deposition of the contact material layers for contacts 175, 177 and 179 can be performed using one or more deposition techniques described above, followed by planarization using a planarization process, such as, for example, CMP.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A semiconductor device, comprising:
a first vertical transistor comprising a first lower source/drain region and a first upper source/drain region disposed on a semiconductor substrate;
a second vertical transistor comprising a second lower source/drain region and a second upper source/drain region stacked on the first vertical transistor;
an isolation layer disposed between the first upper source/drain region of the first vertical transistor and the second lower source/drain region of the second vertical transistor;
at least one dielectric layer distinct from the isolation layer, wherein the at least one dielectric layer is disposed on lateral sides of the isolation layer and disposed on the first vertical transistor and the second vertical transistor;
wherein the isolation layer has a greater lateral width than a lateral width of the first upper source/drain region and a lateral width of the second lower source/drain region;
wherein an entirety of respective ones of lateral sides of the first upper source/drain region and of the second lower source/drain region are recessed with respect to the lateral sides of the isolation layer; and
wherein the isolation layer comprises a rare earth oxide.

2. The semiconductor device according to claim 1, wherein:
the first vertical transistor further comprises:
a first channel region extending vertically from the first lower source/drain region, wherein the first upper source/drain region is disposed on an upper portion of the first channel region; and
a first gate region disposed around the first channel region; and
the second vertical transistor further comprises:
a second channel region extending vertically from the second lower source/drain region, wherein the second upper source/drain region is disposed on an upper portion of the second channel region; and
a second gate region disposed around the second channel region.

3. The semiconductor device according to claim 2, wherein the first gate region comprises a first gate metal layer having a first doping type, and the second gate region comprises a second gate metal layer having a second doping type different from the first doping type.

4. The semiconductor device according to claim 2, further comprising:
a first lower spacer region formed around portions of the first lower source/drain region and the first channel region; and a first upper spacer region formed around portions of the first upper source/drain region and the first channel region.

5. The semiconductor device according to claim 4, wherein the first lower spacer region is formed below the first gate region and the first upper spacer region is formed over the first gate region.

6. The semiconductor device according to claim 4, further comprising:
a second lower spacer region formed around portions of the second lower source/drain region and the second channel region; and
a second upper spacer region formed around portions of the second upper source/drain region and the second channel region.

7. The semiconductor device according to claim 6, wherein the second lower spacer region is formed below the second gate region and the second upper spacer region is formed over the second gate region.

8. The semiconductor device according to claim 1, wherein the first vertical transistor comprises an n-type field-effect transistor (nFET) and the second vertical transistor comprises a p-type field-effect transistor (pFET).

9. The semiconductor device according to claim 1, wherein the rare earth oxide comprises at least one of erbium oxide ($Er_2O_3$), neodymium oxide ($Nd_2O_3$), praseodymium oxide ($Pr_2O_3$), cerium oxide ($CeO_2$), lanthanum oxide ($La_2O_3$), yttrium oxide ($Y_2O_3$) and gadolinium oxide ($Gd_2O_3$).

10. The semiconductor device according to claim 1, wherein the first vertical transistor comprises a first doping type and the second vertical transistor comprises a second doping type different from the first doping type.

11. The semiconductor device according to claim 10, wherein the first doping type is n-type and the second doping type is p-type.

12. The semiconductor device according to claim 1, wherein the at least one dielectric layer comprises a dielectric liner layer.

13. A semiconductor device, comprising:
a first vertical transistor comprising a first doping type;
a second vertical transistor stacked on the first vertical transistor, wherein the second vertical transistor comprises a second doping type different from the first doping type;
an isolation layer vertically stacked between source/drain regions of the first and second vertical transistors; and
at least one dielectric layer distinct from the isolation layer, wherein the at least one dielectric layer is disposed on lateral sides of the isolation layer and disposed on the first vertical transistor and the second vertical transistor;
wherein the isolation layer has a greater lateral width than lateral widths of the source/drain regions of the first and second vertical transistors;
wherein an entirety of respective ones of lateral sides of the source/drain regions of the first and second vertical transistors are recessed with respect to the lateral sides of the isolation layer; and
wherein the isolation layer comprises a rare earth oxide.

14. The semiconductor device according to claim 13, wherein:
the first vertical transistor comprises:
a first lower source/drain region;
a first channel region extending vertically from the first lower source/drain region;
a first upper source/drain region disposed on an upper portion of the first channel region; and
a first gate region disposed around the first channel region; and
the second vertical transistor comprises:
a second lower source/drain region disposed on the isolation layer;
a second channel region extending vertically from the second lower source/drain region;
a second upper source/drain region disposed on an upper portion of the second channel region; and
a second gate region disposed around the second channel region.

15. The semiconductor device according to claim 14, wherein the first gate region comprises a first gate metal layer having the first doping type, and the second gate region comprises a second gate metal layer having the second doping type.

16. The semiconductor device according to claim 14, further comprising:
a first lower spacer region formed around portions of the first lower source/drain region and the first channel region; and
a first upper spacer region formed around portions of the first upper source/drain region and the first channel region.

17. The semiconductor device according to claim 16, wherein the first lower spacer region is formed below the first gate region and the first upper spacer region is formed over the first gate region.

18. The semiconductor device according to claim 16, further comprising:
a second lower spacer region formed around portions of the second lower source/drain region and the second channel region; and
a second upper spacer region formed around portions of the second upper source/drain region and the second channel region.

19. The semiconductor device according to claim 18, wherein the second lower spacer region is formed below the second gate region and the second upper spacer region is formed over the second gate region.

20. The semiconductor device according to claim 13, wherein the at least one dielectric layer comprises a dielectric liner layer.

* * * * *